United States Patent [19]
Ito

[11] Patent Number: 5,791,549
[45] Date of Patent: Aug. 11, 1998

[54] ULTRASONIC SINGLE-POINT BONDER FOR SEMICONDUCTOR DEVICE FABRICATION

[75] Inventor: Hiroki Ito, Yamagata, Japan

[73] Assignee: NEC Corporation, Japan

[21] Appl. No.: 564,438

[22] Filed: Nov. 29, 1995

[30] Foreign Application Priority Data

Nov. 29, 1994 [JP] Japan .................... 6-294867

[51] Int. Cl.[6] .................................................. H01L 21/607
[52] U.S. Cl. ................................................ 228/1.1; 228/4.5
[58] Field of Search .................... 156/73.1, 73.2, 156/580.1, 580.2; 228/110.1, 180.1, 180.5, 1.1, 4.5

[56] References Cited

U.S. PATENT DOCUMENTS

| | | | |
|---|---|---|---|
| 3,376,635 | 4/1968 | Moesker | 228/180.5 |
| 3,698,985 | 10/1972 | Robinson | 228/1.1 |
| 3,840,169 | 10/1974 | Steranko et al. | 228/4.5 X |
| 4,301,958 | 11/1981 | Hatakenaka et al. | 228/4.5 |
| 4,759,073 | 7/1988 | Shah et al. | 228/1.1 |
| 4,958,762 | 9/1990 | Shimizu et al. | 228/1.1 |
| 5,156,318 | 10/1992 | Suzuki et al. | 228/4.5 |
| 5,223,063 | 6/1993 | Yamazaki et al. | 156/73.2 |
| 5,364,009 | 11/1994 | Takahashi et al. | 228/110.1 |

*Primary Examiner*—James Sells
*Attorney, Agent, or Firm*—Hayes, Soloway, Hennessey, Grossman & Hage, P.C.

[57] ABSTRACT

A single-point bonder is provided ultrasonically bonding lead fingers extending along different directions onto a semiconductor chip with satisfactory reliability. The bonder contains a first bonding tool for bonding a first set of lead fingers onto a semiconductor chip using a first ultrasonic vibration along a first direction, and a second bonding tool for bonding a second set of lead fingers onto the chip using a second ultrasonic vibration along a second direction different from the first direction. Preferably, the first bonding tool has a first ultrasonic horn for transmitting the first ultrasonic vibration. The second bonding tool has a second ultrasonic horn for transmitting the second ultrasonic vibration. The first and second horns extend along the first and second directions, respectively. The first and second ultrasonic vibrations are parallel to the longitudinal directions of the first and second horns, respectively. The first ultrasonic vibration may be parallel to the longitudinal directions of the first horn, and the second ultrasonic vibration may be parallel to a rotation direction of the second horn.

10 Claims, 5 Drawing Sheets

5,791,549

ULTRASONIC SINGLE-POINT BONDER FOR SEMICONDUCTOR DEVICE FABRICATION

BACKGROUND OF THE INVENTION

1. Field of the Invention

The present invention relates to a single-point bonder and more particularly, to a single-point bonder for use in semiconductor device fabrication that uses ultrasonic vibrational energy.

2. Description of the Prior Art

FIGS. 1 and 2 show a conventional ultrasonic single-point bonder 300, which contains a tape loader 51 and a tape unloader 52 fixed apart from each other. The tape loader 51 is loaded with a tape automated bonding (TAB) tape 55. The tape unloader 52 unloads the tape 55 from the tape loader 51 to transfer it in a direction X.

The tape 55 has square device holes 56 arranged on the longitudinal center line of the tape 55 at regular intervals. First and second sets of lead fingers 71a and 71b, which extend along a direction Y perpendicular to the direction X, are attached onto the tape 55 in the periphery of each hole 56, as shown in FIG. 2. Third and fourth sets of lead fingers 72a and 72b, which extend along the direction X, are attached onto the tape 55 in the periphery of each hole 56.

A wafer loader 53 is fixed near the tape loader 51. A bonding table 54 is placed near the tape 55 between the tape loader 51 and the tape unloader 52. The wafer loader 53 successively loads semiconductor chips or pellets 70 on the bonding table 54. The bonding table 54 with chip 70 thereon moves toward the tape 55 and apart therefrom as shown by an arrow 58.

The bonding table 54 with the chip 70 thereon stops right below a corresponding one of the device holes 56, positioning the chip 70 placed on the table 54 within the hole 56. An ultrasonic bonding process for the first, second, third and fourth lead fingers 71a, 71b, 72a and 72b, i.e., an inner lead bonding (ILB) process, is then successively performed one by one using an ultrasonic bonding tool 60, resulting in the fingers 71a, 71b, 72a and 72b being bonded onto corresponding bonding pads (not shown) of the chip 70. After the inner lead bonding process is finished, the table 54 returns to the original position as shown in FIG. 1 to receive a succeeding chip 70 from the wafer loader 53.

The ultrasonic bonding tool 60 is placed on the opposite side of the tape 55 from the wafer table 53. The tool 60 includes an ultrasonic oscillator 61, an ultrasonic vibrator 62, an ultrasonic horn 63, and a bonding tip or capillary 64. The oscillator 61 produces an ultrasound with a specified frequency range. The vibrator 62 receives the ultrasound to produce an ultrasonic, longitudinal vibration in a direction 65 parallel to direction Y. The horn 63 transmits the ultrasonic vibration to the bonding tip 64 fixed to the end of the horn 63. The tip 64 vibrates in the longitudinal direction of the horn 63, i.e., in direction Y, due to the ultrasonic vibration.

With the conventional single-point bonder 300 shown in FIGS. 1 and 2, no problem exists relative to bonding of the first and second sets of the lead fingers 71a and 71b extending along the direction Y, because the ultrasonic vibration direction of the capillary 64 is parallel to, the longitudinal direction of the lead fingers 71a and 71b.

However, a problem exists with respect to bonder 300 in that the third and fourth sets of the lead fingers 72a and 72b extending along direction X cannot be bonded to the corresponding pads of the semiconductor chip 70 with satisfactory reliability. This problem is caused by the following.

The ultrasonic vibration direction of the bonding tip 64 is parallel to the arrow 65 (i.e., direction Y) perpendicular to the longitudinal direction (i.e. direction X) of the lead fingers 72a and 72b. Since the rigidity of the lead fingers 72a and 72b in direction Y (i.e., their transverse direction) is less than that in direction X (i.e., their longitudinal direction), the fingers 72a and 72b are vibrated at their ends by the applied ultrasonic vibration, resulting in resonance of the fingers 72a and 72b with the vibrating tip 64.

Because of the resonance, the bonding tip 64 tends to be separated from a corresponding one of the fingers 72a and 72b, preventing the bonding process itself. Alternately, even if bonding is performed, bonding strength tends to decrease. This trouble often takes place when the lead fingers 72a and 72b are narrow (for example, about 30 to 50 μm) in width and pitch.

SUMMARY OF THE INVENTION

Accordingly, an object of the present invention is to provide a single-point bonder that for ultrasonically bonding lead fingers extending along different directions onto a semiconductor chip with satisfactory reliability.

A single-point bonder according to the invention contains a first bonding tool for bonding a first set of lead fingers onto a semiconductor chip using a first ultrasonic vibration along a first direction, and a second bonding tool for bonding a second set of lead fingers onto the chip using a second ultrasonic vibration along a second direction different from the first direction.

With the single-point bonder according to the invention, the first bonding tool uses the first ultrasonic vibration along the first direction and the second bonding tool uses the second ultrasonic vibration along the second direction different from the first direction. The first set of lead fingers is bonded by the first bonding tool and the second set of lead fingers is bonded by the second bonding tool. Accordingly, both of the first and second sets of lead fingers extending along the different directions can be bonded with satisfactory reliability.

In a preferred embodiment, the first bonding tool has a first ultrasonic horn for transmitting a first ultrasonic vibration, the first horn extending along the first direction. The second bonding tool has a second ultrasonic horn for transmitting a second ultrasonic vibration, the second horn is extending along the second direction. The first and second ultrasonic vibrations are parallel to the longitudinal directions of the first and second horns, respectively.

In this case, the same ultrasonic horn can be used as the first and second ultrasonic horns if one of them is placed along the first direction, and the other is placed along the second direction.

In another preferred embodiment, the first bonding tool has a first ultrasonic horn for transmitting a first ultrasonic vibration, the first horn extending along the first direction. The second bonding tool has a second ultrasonic horn for transmitting a second ultrasonic vibration, the second horn extending along the first direction. The first ultrasonic vibration is parallel to the longitudinal directions of the first horn. The second ultrasonic vibration is parallel to a rotation direction of the second horn.

In this case, the first and second bonding tools can be placed closely to each other.

Although the angle between the first and second directions may be any value, it is preferably a right angle.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described in detail below while referring to the attached drawings.

FIRST EMBODIMENT

Figure 1:
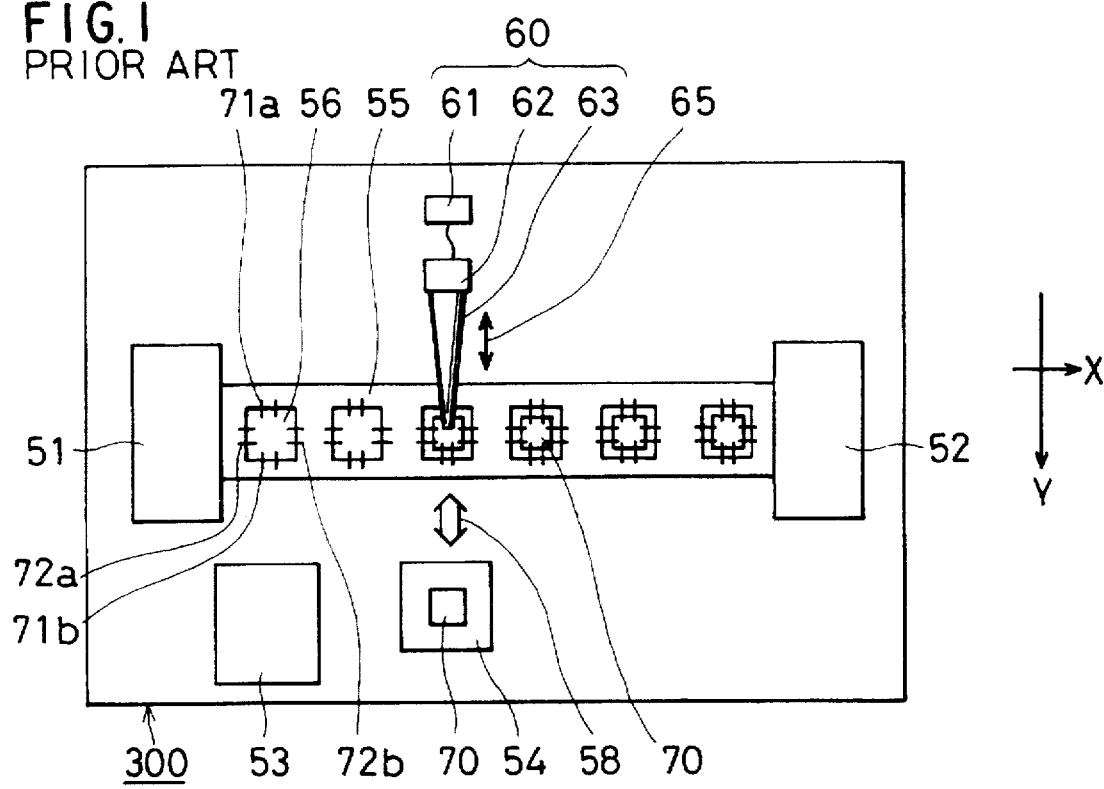
FIG. 1 is a schematic plan view showing the layout of a conventional single-point bonder.
Figure 2:
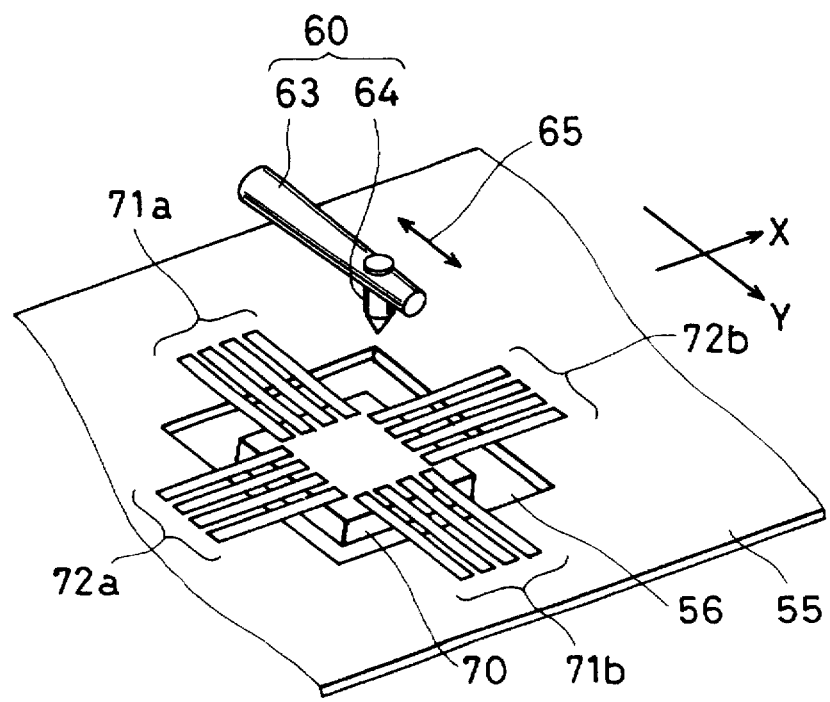
FIG. 2 is a partial, enlarged, perspective view of the conventional single-point bonder of FIG. 1.
Figure 3:
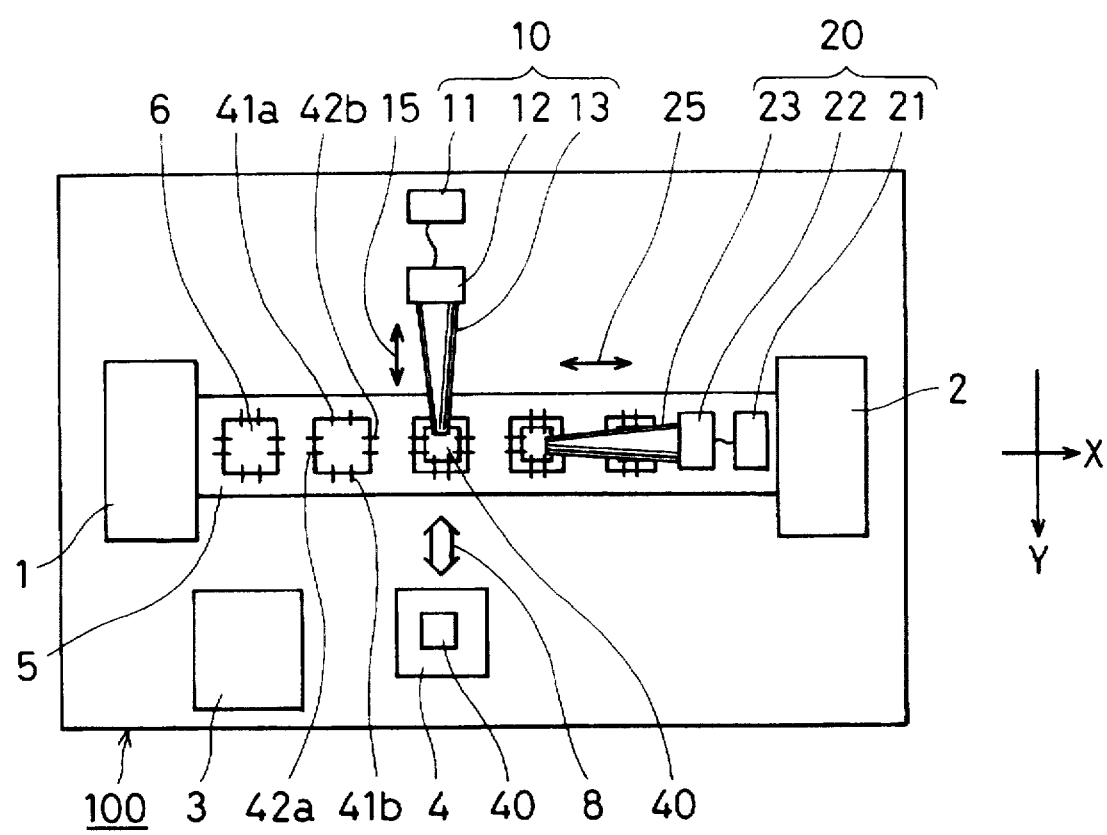
FIG. 3 is a schematic plan view showing the layout of a single-point bonder according to a first embodiment of the invention.
Figure 4:
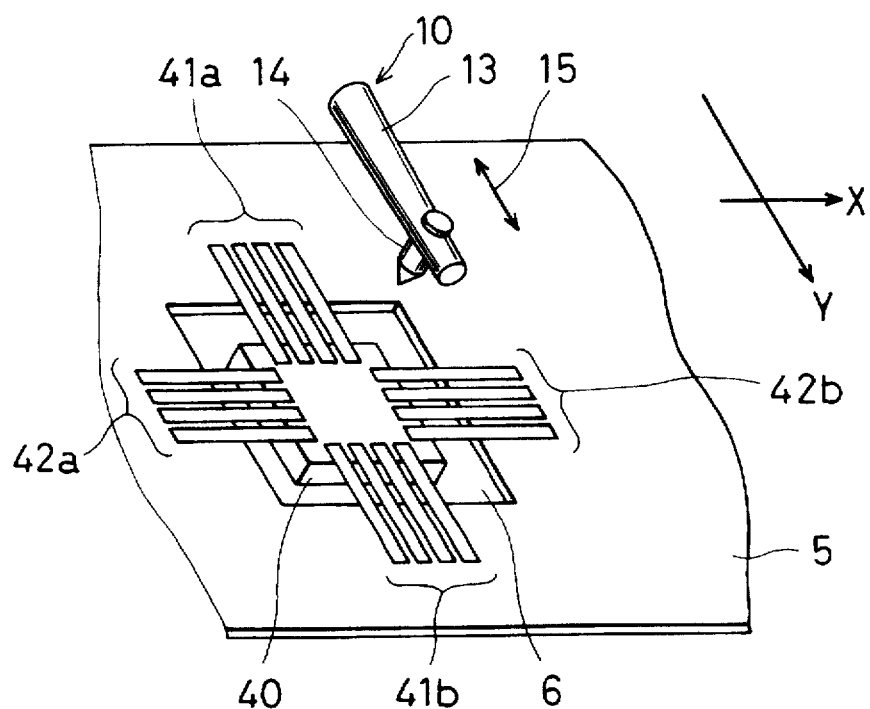
FIG. 4 is a partial, enlarged, perspective view of the single-point bonder according to the first embodiment of FIG. 3, in which a first bonding process is performed using an ultrasonic vibration along direction Y.
Figure 5:
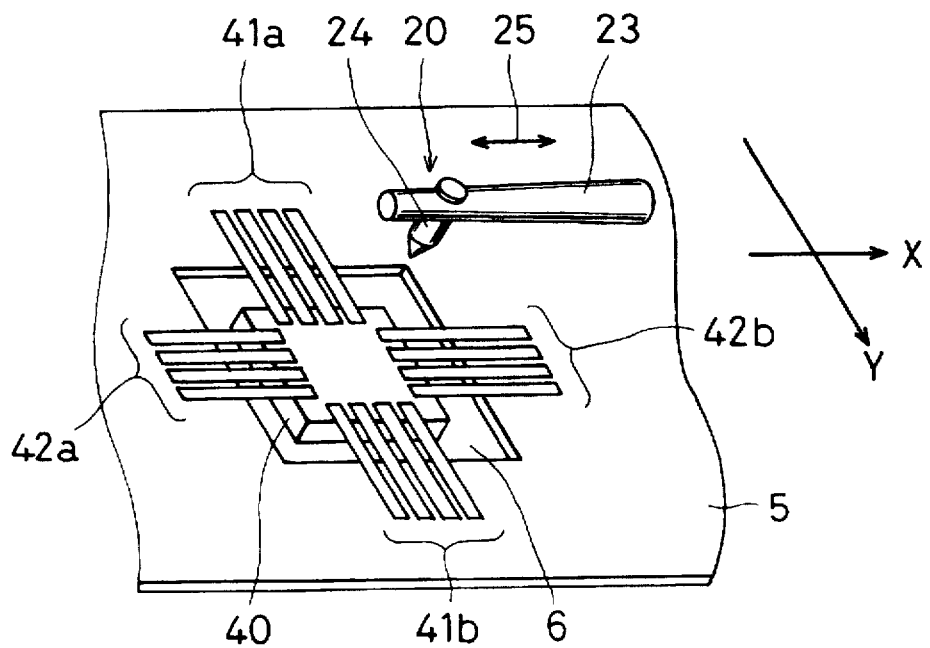
FIG. 5 is a partial, enlarged, perspective view of the single-point bonder according to the first embodiment of FIG. 3, in which a second bonding process is performed using an ultrasonic vibration along direction X.

In FIGS. 3, 4 and 5, an ultrasonic single-point bonder 100 according to a first embodiment includes a tape loader 1 and a tape unloader 2 placed apart from each other. The tape loader 1 is loaded with a TAB tape 5. The tape unloader 2 unloads the tape 5 from the tape loader 1 to transfer it in a direction X.

The tape 5 has square device holes 6 arranged on the longitudinal center line of the tape 5 at regular intervals. First and second sets of lead fingers 41a and 41b, which extend along direction Y, perpendicular to direction X, are attached onto the tape 5 in the periphery of each hole 6, as shown in FIGS. 3 and 4. Third and fourth sets of lead fingers 42a and 42b, which extend along the direction X, are attached onto the tape 5 in the periphery of each hole 6.

A wafer loader 3 is placed near the tape loader 1. A bonding table 4 is located near the tape 5 between the tape loader 1 and the tape unloader 2. The wafer loader 3 successively loads semiconductor chips or pellets 40 on the bonding table 4. The bonding table 4 with chip 40 thereon moves toward the tape 5 and apart therefrom, as shown by an arrow 8. In other words, the table 4 moves between a waiting position shown in FIG. 3 and a bonding position that is right below a corresponding one of the device holes 6. Thus, the chip 40 placed on the bonding table 4 is positioned within a respective hole 6 so as to be exposed through from the tape 5.

An ultrasonic bonding process for the first, second, third and fourth lead fingers 41a, 41b, 42a and 42b is then successively performed one by one using a first ultrasonic bonding tool 10 and a second ultrasonic bonding tool 20, resulting in the fingers 71a, 71b, 72a and 72b being bonded onto corresponding bonding pads (not shown) of the chip 40. After a bonding process is finished, the bonding table 4 returns to the original waiting position shown in FIG. 3 to receive a succeeding chip 40 from the wafer loader 3.

As shown in FIG. 4, the first ultrasonic bonding tool 10 is placed on the opposite side of the tape 5 from the wafer table 3. The first tool 10 includes an ultrasonic oscillator 11, an ultrasonic vibrator 12, an ultrasonic horn 13, and a bonding tip 14. The oscillator 11 produces an ultrasound. The vibrator 12 receives the ultrasound to produce an ultrasonic, longitudinal vibration in a direction 15 parallel to direction Y. The horn 13 transmits the ultrasonic vibration to the tip 14 fixed to the end of the horn 13. The tip 14 vibrates longitudinally, i.e., in the direction Y due to the ultrasonic vibration.

The oscillator 11 has a cylindrical shape whose polarization direction is in the longitudinal direction (Y direction) of the oscillator 11. The vibrator 12 longitudinally vibrates in the direction Y in response to the polarization of the oscillator 11.

As shown in FIG. 5, the second ultrasonic bonding tool 20 is placed right over the tape 5 near the tape unloader 2. The second tool 20 includes an ultrasonic oscillator 21, an ultrasonic vibrator 22, an ultrasonic horn 23, and a bonding tip 24. The oscillator 21 produces an ultrasound. The vibrator 22 receives the ultrasound to produce an ultrasonic, longitudinal vibration in a direction 15 parallel to direction Y. The horn 23 transmits the ultrasonic vibration to the tip 24 fixed to the end of the horn 23. The tip 24 vibrates longitudinally, i.e., in the direction X due to the ultrasonic vibration.

The oscillator 21 has a cylindrical shape whose polarization direction is in the longitudinal direction (X direction) of the oscillator 21. The vibrator 22 longitudinally vibrates in the direction X in response to the polarization of the oscillator 21.

With the single-point bonder 100 according to the first embodiment, the first and second sets of lead fingers 41a and 41b are bonded by the first bonding tool 10. Specifically, when the TAB tape 5 is temporarily stopped, the bonding table 4 with the semiconductor chip 40 thereon is moved from the waiting position to the bonding position along the arrow 8. In the bonding position, the chip 40 is positioned within a corresponding one of the device holes 6. Then, the lead fingers 41a and 41b extending along the direction Y are bonded onto the corresponding bonding pads (not shown) of the chip 40 using the first ultrasonic bonding tool 10, as shown in FIG. 4, which is a first ILB process.

The first ultrasound used for the first ILB process is of a sine wave whose frequency is about 60 kHz and whose amplitude is 1 to 2 μm. The vibration direction is Y. The lead fingers 41a and 41b are heated up to about 200 degree C. due, to the applied ultrasound under a pressing force of about 100 g.

During the first ILB process, the remaining third and fourth sets of lead fingers 42a and 42b are not bonded.

Next, the third and fourth sets of lead fingers 42a and 42b are bonded by the second bonding tool 20, after the first and second sets of lead fingers 42a and 42b along the direction X are bonded onto the chip 40, using the second ultrasonic bonding tool 20, which is a second ILB process.

The second ILB process is performed under the same conditions as those of the first ILE process.

As described above, with the single-point bonder according to the first embodiment, the first and second sets of lead fingers 41a and 41b are applied with the first ultrasonic vibration along the Y direction so as to be bonded by the first bonding tool 10. Similarly, the third and fourth sets of lead fingers 42a and 42b are applied with the second ultrasonic vibration along the X direction so as to be bonded by the second bonding tool 10.

Accordingly, all of the first to fourth sets of lead fingers 41a, 41b, 42a and 42b are applied with the ultrasonic vibrations along the longitudinal direction thereof, resulting in satisfactorily high bonding strength between the chip 40 and the fingers 41a, 41b, 42a and 42b. Also, ultrasonically bonded lead fingers extend along different directions onto a semiconductor chip with satisfactory reliability.

SECOND EMBODIMENT

Figure 6:
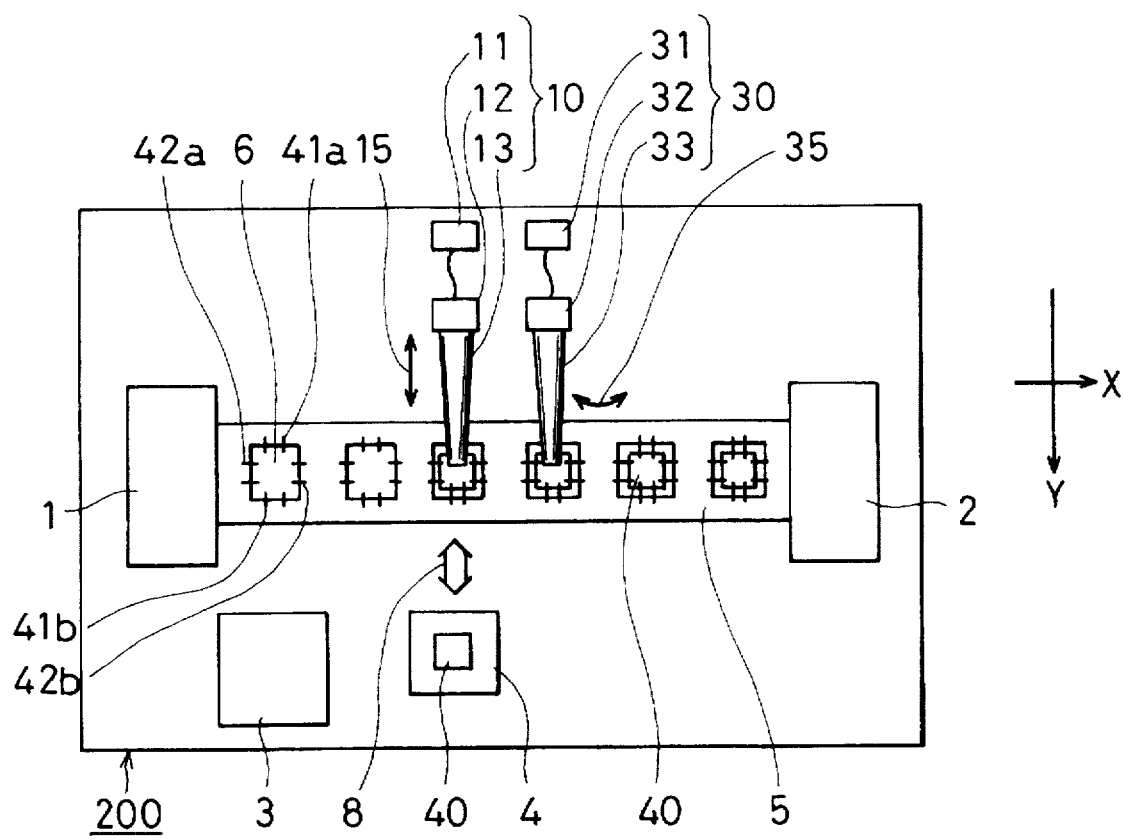
FIG. 6 is a schematic plan view showing the layout of a single-point bonder according to a second embodiment of the invention.
Figure 7:
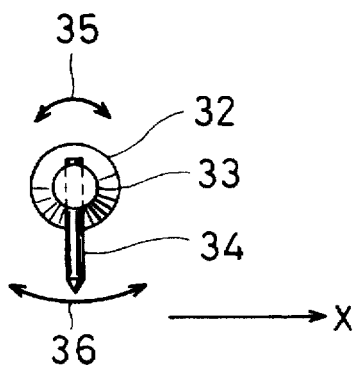
FIG. 7 is a partial, enlarged view of the second bonding tool in the single-point bonder according to the second embodiment of FIG. 6.
Figure 8:
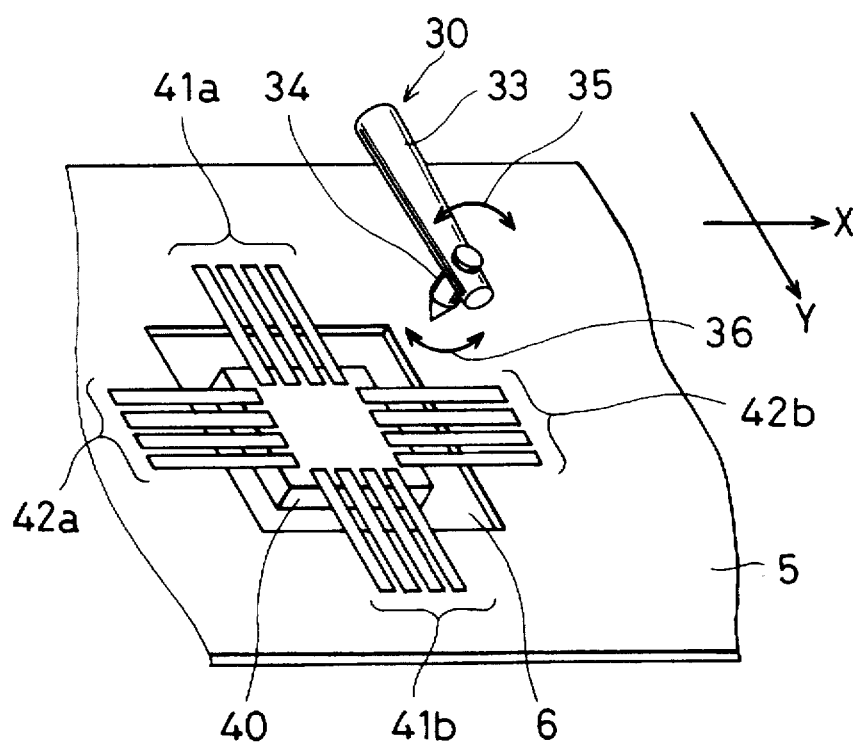
FIG. 8 is a partial, enlarged, perspective view of the single-point bonder according to the second embodiment of FIG. 6, in which a second bonding process is performed using an ultrasonic momentary vibration in the direction X.

FIGS. 6, 7 and 8 show an ultrasonic single-point bonder 200 according to a second embodiment, which is the same in structure as the first embodiment except for the second bonding tool 20. Therefore, by adding the same reference numerals to the corresponding elements in the first and second embodiments, an explanation for the common structure is omitted here for the sake of simplification of description.

As shown in FIG. 6, the third bonding tool 30 is provided adjacent to the first bonding tool 10. The third tool 30 includes an ultrasonic oscillator 31, an ultrasonic vibrator 32, an ultrasonic horn 33, and a bonding tip 34. The oscillator 31 produces an ultrasound. The vibrator 32 receives the ultrasound to produce an ultrasonic moment or rotating vibration along the circumference of the vibrator 32. The horn 33 transmits the ultrasonic rotating vibration to the tip 34 fixed to the end of the horn 33. The tip 34 vibrates momentarily along the arrow 35, i.e., in the direction 36.

With the single-point bonder 200 according to the second embodiment, the same effect or advantage as that of the first embodiment is obtained.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A single-point bonder comprising:
   a first bonding tool for bonding a first set of lead fingers onto a semiconductor chip using a first ultrasonic vibration along a first direction; and
   a second bonding tool for bonding a second set of lead fingers onto the chip using a second ultrasonic vibration along a second direction different from said first direction;
   wherein said first set of lead fingers is bonded by said first ultrasonic vibration, and said second set of lead fingers are bonded by said second ultrasonic vibration, and also wherein said first direction is a linear direction and second ultrasonic vibration is a rotating vibration.

2. A single-point bonder as claimed in claim 1, wherein said first bonding tool has a first ultrasonic horn for transmitting said first ultrasonic vibration to a first bonding tip, said first horn extending along said first direction; and,
   said second bonding tool has a second ultrasonic horn for transmitting said second ultrasonic vibration to a second bonding tip so as to cause said second tip to vibrate with said rotating vibration.

3. A single-point bonder as claimed in claim 2, wherein both said first and second ultrasonic horns extend perpendicular to a transfer direction of said semiconductor chip.

4. A single-point bonder as claimed in claim 1, wherein
   said first bonding tool has a first ultrasonic horn for transmitting said first ultrasonic vibration to a first bonding tip, said first horn extending along said first direction;
   said second bonding tool has a second ultrasonic horn for transmitting said second ultrasonic vibration to a second bonding tip, said second horn extending along said first direction;
   said first ultrasonic vibration is parallel to a longitudinal direction of said first horn, and said second ultrasonic vibration is parallel to a rotation direction of said second horn.

5. A single-point bonder as claimed in claim 4, wherein said first ultrasonic horn of said first bonding tool and said second ultrasonic horn of said second bonding tool extend perpendicular to a transfer direction of said semiconductor chip.

6. A single-point bonder comprising:
   a tape loader on which a TAB tape is loaded, said tape having device holes arranged at intervals, a first set of lead fingers extending along a first direction, and a second set of lead fingers extending along a second direction perpendicular to said first direction;
   said first and said second sets of lead fingers being attached onto the tape in the vicinity of respective device holes;
   a tape unloader provided apart from said tape loader, said tape unloader unloading said tape from said tape loader;
   a first bonding tool for bonding said first set of lead fingers onto a semiconductor chip using a first ultrasonic vibration along said first direction;
   a second bonding tool for bonding said second set of lead fingers onto said semiconductor chip using a second ultrasonic vibration along said second direction;
   a bonding table provided between said tape loader and said tape unloader, said bonding table for being moved between a waiting position and a bonding position; and
   a chip loader for successively loading said semiconductor chip on said bonding table at said waiting position;
   wherein said bonding table on which said semiconductor chip is placed by said chip loader is located right below a corresponding one of said device holes, positioning said chip within said hole;
   and wherein said first set of lead fingers is bonded onto said chip one by one using said first bonding tool, and said second set of lead fingers is bonded onto said chip one by one using said second bonding tool.

7. A single-point bonder as claimed in claim 6, wherein said first bonding tool has a first ultrasonic horn for transmitting a first ultrasonic vibration to a first bonding tip, said first horn extending along said first direction;
   said second bonding tool has a second ultrasonic horn for transmitting a second ultrasonic vibration to a second bonding tip, said second horn extending along said second direction; and
   said first and second ultrasonic vibrations are parallel to longitudinal directions of said first and second horns, respectively.

8. A single-point bonder as claimed in claim 7, wherein said first ultrasonic horn of said first bonding tool extends perpendicular to a transfer direction of said semiconductor chip, and said second ultrasonic horn of said second bonding tool extends parallel to said transfer direction.

9. A single-point bonder as claimed in claim 6, wherein
said first bonding tool has a first ultrasonic horn for transmitting a first ultrasonic vibration to a first bonding tip, said first horn extending along said first direction;

said second bonding tool has a second ultrasonic horn for transmitting a second ultrasonic vibration to a second bonding tip, said second horn extending along said second direction; and said first ultrasonic vibration is parallel to a longitudinal direction of said first horn, and said second ultrasonic vibration is parallel to a longitudinal direction of said second horn.

10. A single-point bonder as claimed in claim 9, wherein said first ultrasonic horn of said first bonding tool extends perpendicular to a transfer direction of said semiconductor chip in said bonder and said second ultrasonic horn of said second bonding tool extends parallel to said transfer direction of said semiconductor chip.

* * * * *